(12) United States Patent
Tonda (10) Patent No.: US 6,356,064 B1
(45) Date of Patent: Mar. 12, 2002

(54) BAND-GAP REFERENCE CIRCUIT (75) Inventor: Yasuhiro Tonda, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/715,680

(22) Filed: Nov. 17, 2000

(30) Foreign Application Priority Data

Nov. 22, 1999 (JP) .......................................... 11-331908

(51) Int. Cl.[7] ................................................. G05F 3/16
(52) U.S. Cl. ........................ 323/313; 323/314; 327/539
(58) Field of Search ............................... 323/311, 312, 323/313, 314, 901; 327/538, 541, 543

(56) References Cited

U.S. PATENT DOCUMENTS

| | | | | |
|---|---|---|---|---|
| 4,396,883 A | * | 8/1983 | Holloway et al. | 323/313 |
| 4,740,742 A | * | 4/1988 | Gontowski, Jr. | 323/313 |
| 5,061,862 A | | 10/1991 | Tamagawa | |
| 5,087,830 A | | 2/1992 | Cave et al. | |
| 5,867,013 A | * | 2/1999 | Yu | 323/314 |
| 5,955,873 A | * | 9/1999 | Maccarrone et al. | 323/314 |
| 6,084,388 A | * | 7/2000 | Toosky | 323/313 |
| 6,201,435 B1 | * | 3/2001 | Chou | 327/543 |
| 6,259,240 B1 | * | 7/2001 | Smith | 323/313 |

FOREIGN PATENT DOCUMENTS

| | | |
|---|---|---|
| EP | 0 676 857 A2 | 10/1995 |
| JP | 8-186484 | 7/1996 |

* cited by examiner

Primary Examiner—Adolf Deneke Berhane
(74) Attorney, Agent, or Firm—Hutchins, Wheeler & Dittmar (57) ABSTRACT

A band-gap reference circuit generates and supplies a predetermined stable voltage (VREF). The band-gap reference circuit is comprised of three major circuits: a start-up circuit, which is comprised of a start-up transistor that is smaller than each of those in a band-gap circuit which generates a predetermined stable voltage and which outputs a start signal; a signal level converter, which converts said start signal to a second start signal that is supplied to said start-up transistor; and the band-gap circuit. The start-up transistor has a threshold voltage with its absolute value being smaller than each of those of the threshold voltages of transistors in said band-gap circuit. Moreover, the start-up transistor is (1/n) the channel length of said reference-voltage generation transistor and (1/n) the channel width of said reference-voltage generation transistor, where said n denotes a certain positive number larger than 1.

19 Claims, 5 Drawing Sheets

BAND-GAP REFERENCE CIRCUIT

BACKGROUND OF THE INVENTION

1. Field of the Invention

The present invention relates to a band-gap reference circuit. In particular, it relates to a band-gap reference circuit with a start-up circuit attached.

2. Description of the Related Art

Figure 1:
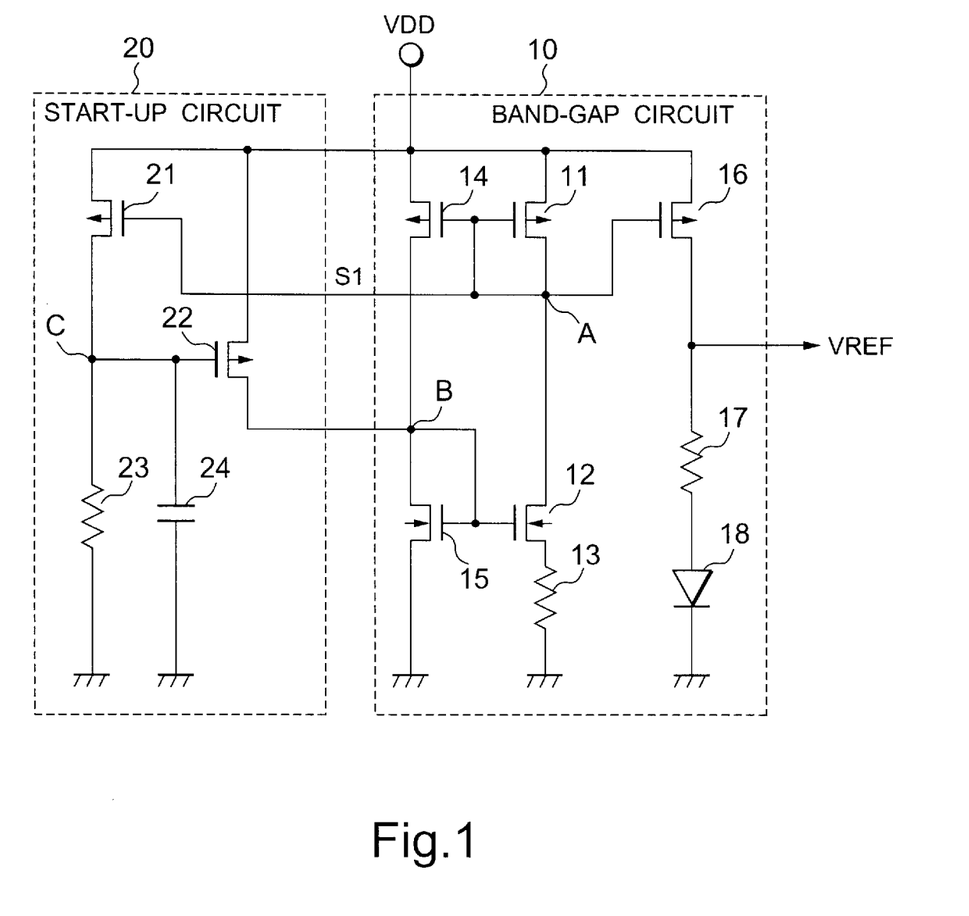
FIG. 1 is a schematic diagram showing the conventional band-gap reference circuit.

Japanese Patent Application Laid-open No. Hei 8-186484 discloses a band-gap reference circuit containing a start-up circuit, which is used to reduce the amount of time that elapses from when the power source voltage is first supplied until a stable operating state is attained in the band-gap reference circuit, which generates a stable (in terms of temperature change), predetermined standard voltage and which operates basically in the PN junction band-gap region. FIG. 1 shows the conventional circuit disclosed in Japanese Patent Application Laid-open No. Hei 8-186484.

The conventional band-gap reference circuit is comprised of a band-gap circuit 10, which generates and outputs the pre-determined, standard voltage $V_{REF}$ during the active state; and a start-up circuit 20, which reduces the time elapsing from when the power source is first applied up to it reaching a stable operating state.

Band-gap circuit 10 is comprised of P-channel MOS transistor (PMOS) 11, which has its source connected to power source $V_{DD}$ (the high voltage side) and has its gate and drain connected to each other and also connected to node A; N-channel MOS transistor (NMOS) 12, which has its drain connected to the drain of PMOS 11; first resistor 13, which has one terminal connected to the source of NMOS 12 and the other terminal connected to the ground (the low voltage side of the power source); PMOS 14, which has its source connected to power source $V_{DD}$ and its gate connected to the drain of PMOS 11; and NMOS 15, which has its drain connected to its gate, and to the drain of PMOS 14 and gate of NMOS 12 and also connected to node B, and which has its source connected to the ground. Band-gap circuit 10 is further comprised of PMOS 16, which has its source connected to power source $V_{DD}$, its gate to node A, and has its drain as a standard voltage output terminal; second resistor 17, which has one terminal connected to the drain of PMOS 16; and diode 18, which has its anode connected to the other terminal of second resistor 17 and its cathode connected to the ground.

According to the Japanese Patent Application Laid-open Hei 8-186484 mentioned above, the reference voltage output $V_{REF}$ when band-gap circuit 10 is in a stable operating state can be given as the following equation:

$$V_{REF} = N \cdot (k \cdot T/q) \cdot \ln M + VF \quad (1)$$

where N is the ratio of the resistance value of the first resistor 13 over the resistance value of the second resistor 17; k is Boltzmann constant; T is absolute temperature; q is the electron charge; M is the ratio of the gate width of NMOS 12 over the gate width of NMOS 15; VF is the forward bias across diode 18. In order to prevent an occurrence of changes in the characteristics of each transistor due to manufacturing irregularities, the each respective channel length of PMOS 11, PMOS 14, PMOS 16, NMOS 12, and NMOS 15 should be at least 10 μm, with the range of 50 μm to 100 μm being most preferable.

Start-up circuit 20 is made up of PMOS 21, which has its source connected to power source $V_{DD}$; PMOS 22, which has its source also connected to power source $V_{DD}$, and which also has its gate connected to the drain of PMOS 21 forming node C; third resistor 23, which has one terminal connected to node C and the other terminal connected to the ground; and capacitor 24, which has one terminal connected to node C and the other terminal connected to the ground. Signal S1 output from node A of band-gap circuit 10 is input to the gate of PMOS 21, and the drain of PMOS 22 is connected to node B in band-gap circuit 10.

Figure 2:
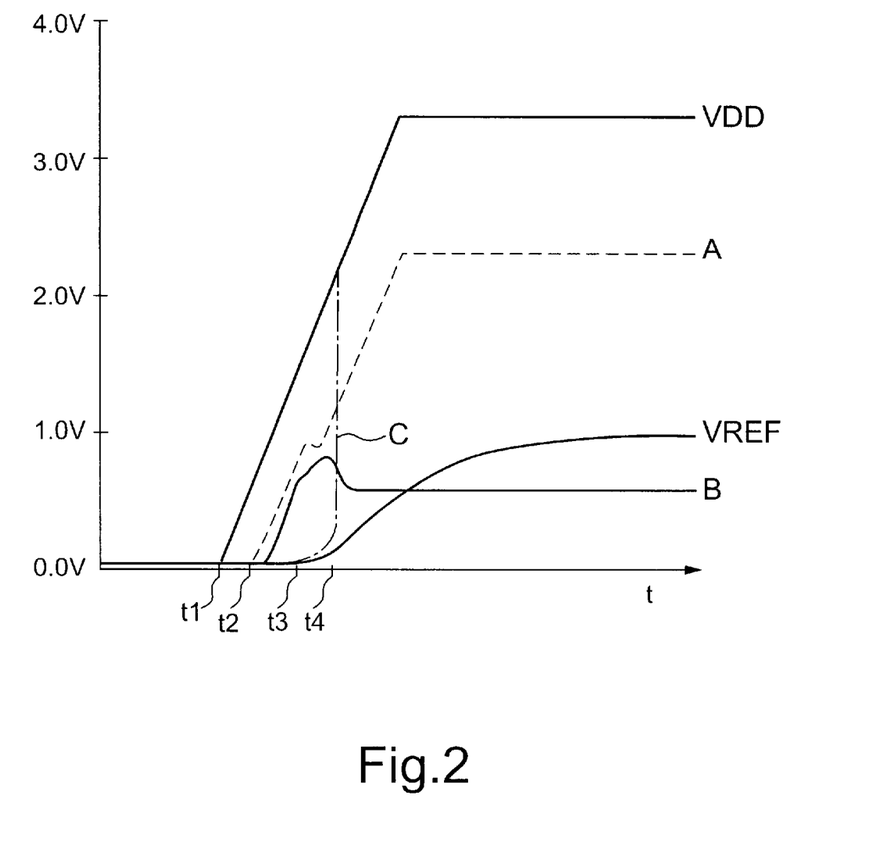
FIG. 2 is a timing chart showing the operation of the conventional band-gap reference circuit shown in FIG. 1 when electric current is first supplied during a restart.

FIG. 2 is an operational timing graph for the conventional circuit at the time when power is first supplied. The workings of the conventional band-gap reference circuit at the time when power is first applied will now be described in detail while referencing FIG. 2.

As shown in FIG. 2, it is assumed that power source voltage $V_{DD}$ starts at nearly 0 V climbing up to 3.3 V. When power source voltage $V_{DD}$ is first supplied, which is shown in FIG. 2 as the time-frame from time-point t1 to t2, since the source of PMOS 11 is the voltage level equal to $V_{DD}$ and its gate is nearly ground level (0 V), the voltage difference between the gate and source of PMOS 11 is smaller than its threshold voltage $V_{tp1}$ of PMOS 11 in terms of their absolute values. This causes the transistor to turn off. Also, since the voltage levels at the source and gate of PMOS 21 are the same as the respective voltage levels at the source and gate of PMOS 11, PMOS 21 is also turned off and accordingly, node C is at ground level.

When power source voltage $V_{DD}$ continues to appreciate past time-point t2, the voltage difference between the gate and source of PMOS 11 becomes larger than the threshold voltage $V_{tp1}$ of PMOS 11 in terms of their absolute values. This causes PMOS 11 to turn on, and node A rises keeping pace with power source voltage $V_{DD}$, while maintaining a difference of roughly $V_{tp1}$ lower than $V_{DD}$. In the same manner, when PMOS 21 is also turned on, the voltage level at node C in start-up circuit 20 begins to appreciate at a remarkably slow rate when compared to the rise in the power source level $V_{DD}$ due to resistor 23 and capacitor 24.

At this point, when all of the PMOS transistors in both band-gap circuit 10 and start-up circuit 20 have the same channel lengths and the same threshold voltage $V_{tp1}$, if the voltage difference between the power source voltage $V_{DD}$ and node C continues to become larger than $V_{tp1}$, in terms of their absolute values, past time-point t2, then the charging of node B is accelerated because PMOS 22 will also be turned on.

At time-point t3, due to the rising voltage level at node B, the gate voltage of NMOS 12 and NMOS 15 surpasses the threshold voltage $V_{tn}$ and they are turned on. As a result, the increase in voltage level at node A temporarily stagnates. Accordingly, the difference between the voltage levels of the gate and source of PMOS 21 surges, turning PMOS 21 on deeply. Moreover, because the PMOS transistor being utilized for PMOS 21 has an extremely large channel width that is hundreds of times larger than that of PMOS 11, at time-point t4 the voltage level of node C comes under the influence of power source voltage $V_{DD}$ and begins a rapid ascent. Then since PMOS 22 turns off as the voltage level of node C approaches that of power source voltage $V_{DD}$, start-up circuit 20 becomes electrically isolated from band-gap circuit 10. Once power source voltage $V_{DD}$ stabilizes at its predetermined voltage level (e.g., 3.3 V in FIG. 2), terminals A and B of band-gap circuit 10, as well as output reference voltage $V_{REF}$ stabilize at their respective pre-determined voltages.

With the band-gap reference circuit with an attached start-up circuit as shown in FIG. 1, when power source voltage $V_{DD}$ is first applied, node B in band-gap circuit 10 momentarily has more charge than start-up circuit 20. As a result, it is possible for a band-gap circuit without the start-up circuit to reach its stable state in a very short time compared to when node B is charged with only the very small amount of current flowing through PMOS 14.

In this conventional band-gap reference circuit, however, the start-up circuit requires an enormous amount of exclusive space since the channel width of PMOS 21 within the start-up circuit must be large, and demands have been made for a reduction in this required surface area. In accordance with these demands, if the channel length of PMOS 21 is reduced by a factor of 1/n compared to the other PMOS transistors then it is possible to reduce the channel width by the same factor of 1/n; therefore the required space for the gate is able to be reduced by a factor of 1/(n+n), but unfortunately when it was tested it became apparent that a new problem had developed.

During testing, a band-gap reference circuit was formed with the PMOS 21 shown in FIG. 1 having a channel width made to be 0.35 μm and the channel width of the other PMOS transistors made to be 80 μm. The power source voltage $V_{DD}$ was reduced from 3.3 V to 0.6 V, then after being held at 0.6 V for a period of 500 ms, re-powered up to reach the voltage level of 3.3 V. When the time required for the reference voltage output $V_{REF}$ to reach the predetermined voltage level and stabilize was measured, it was found that the band-gap reference circuit containing the PMOS 21 with a channel length shortened to 0.35 μm required an inordinate amount of time to stabilize at output reference voltage $V_{REF}$. The following has been devised in order to rectify the cause of this new problem.

In the band-gap reference circuit that was tested, and which had the structure shown in FIG. 1, threshold voltage $V_{tp1}$ of PMOS 11, PMOS 14, PMOS 16, and PMOS 22, which all have 80 μm channel lengths, was −0.9 V, and threshold voltage $V_{tp2}$ of PMOS 21, which has a 0.35 μm channel length, was −0.5V. This reduction in threshold voltage was found to be the cause of the short channel effect.

When the power source voltage $V_{DD}$ is reduced to 0.6 V, PMOS 11 has high impedance. This causes node A to be nearly 0 V. On the other hand, since the threshold voltage of PMOS 21 is −0.5V, it maintains an on state. For this reason, when the power source voltage $V_{DD}$ starts increasing from 0.6 V, the voltage level of node C increases in tandem with power source voltage $V_{DD}$. Accordingly, since the voltage levels at the gate and source of PMOS 22 are both equal to the power source voltage $V_{DD}$, PMOS 22 stays turned off and does not turn on, which means that the start-up circuit 20 does not operate properly. Therefore the band-gap circuit 10 operates as if the start-up circuit 20 did not exist; in other words, node B is charged solely by the very small amount of electrical current flowing through PMOS 14. It is because of this electric gain at node B being so slow that the voltage levels of the gates in neither NMOS 12 nor NMOS 15 reach their respective threshold voltage $V_{tn}$, and thereby begin to operate in the weak inversion region, and as a result cause the band-gap circuit 10 to require an inordinate amount of time to stabilize.

As it has been described above, since the area occupied by PMOS 21, which charges node C within the start-up circuit, is large in the conventional band-gap reference circuit; it restricts possible reductions in the size of the entire band-gap reference circuit. Furthermore, when the channel length of PMOS 21 is shortened in order to reduce the size of the area it occupies, due to the lowest level reached by power source voltage $V_{DD}$ during a short transmission interruption, the start-up circuit may not be able to operate properly.

SUMMARY OF THE INVENTION

The objective of the present invention is to provide a band-gap reference circuit in which the area occupied by PMOS 21 is reduced, thereby reducing the total occupied area of the entire band-gap reference circuit, and one that can start-up properly without regard to how many volts the lowest level reached by power source voltage $V_{DD}$ is during a short transmission interruption.

Figure 3:
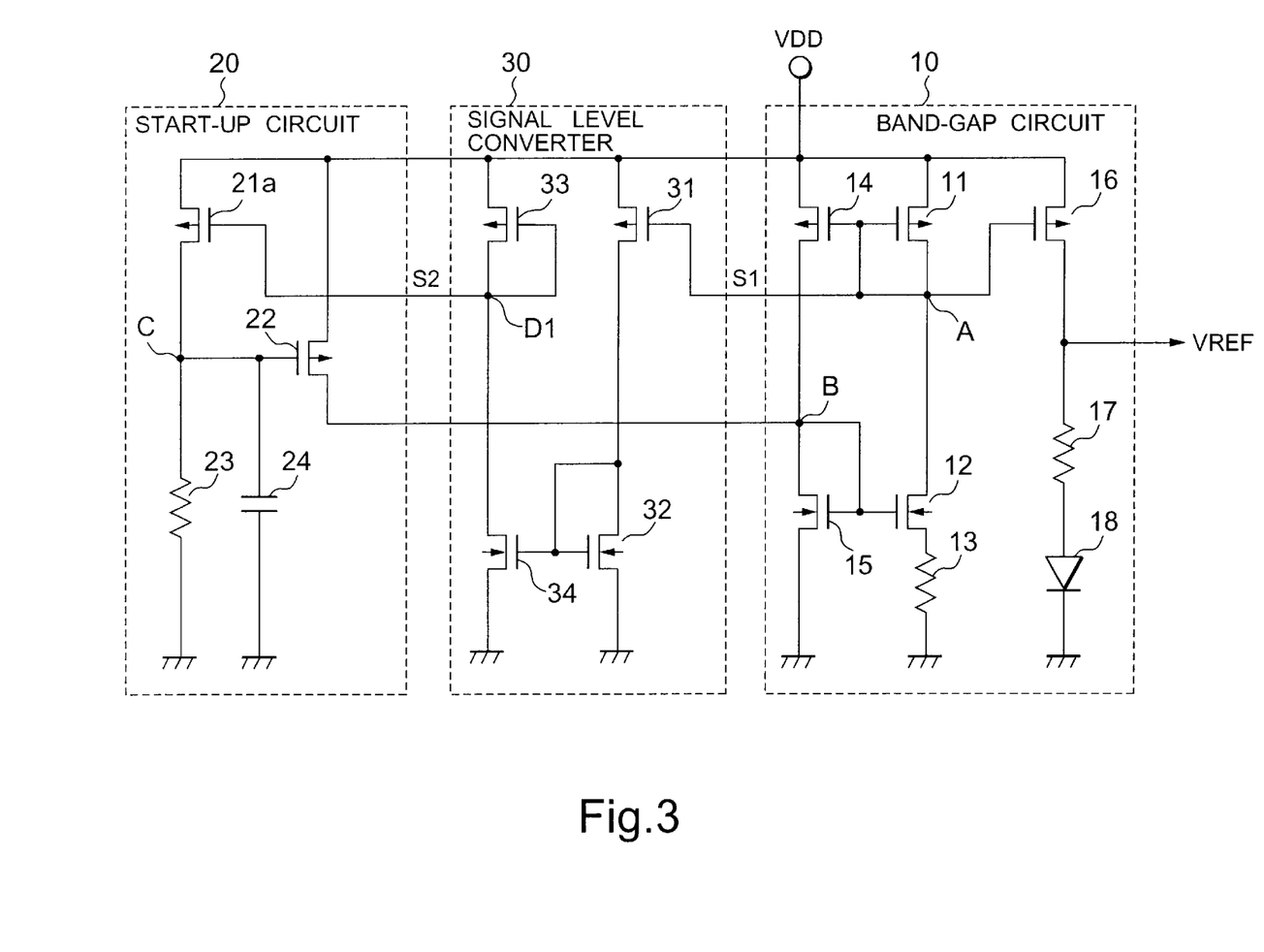
FIG. 3 shows the configuration of a band-gap reference circuit according to the first embodiment of the present invention.
Figure 5:
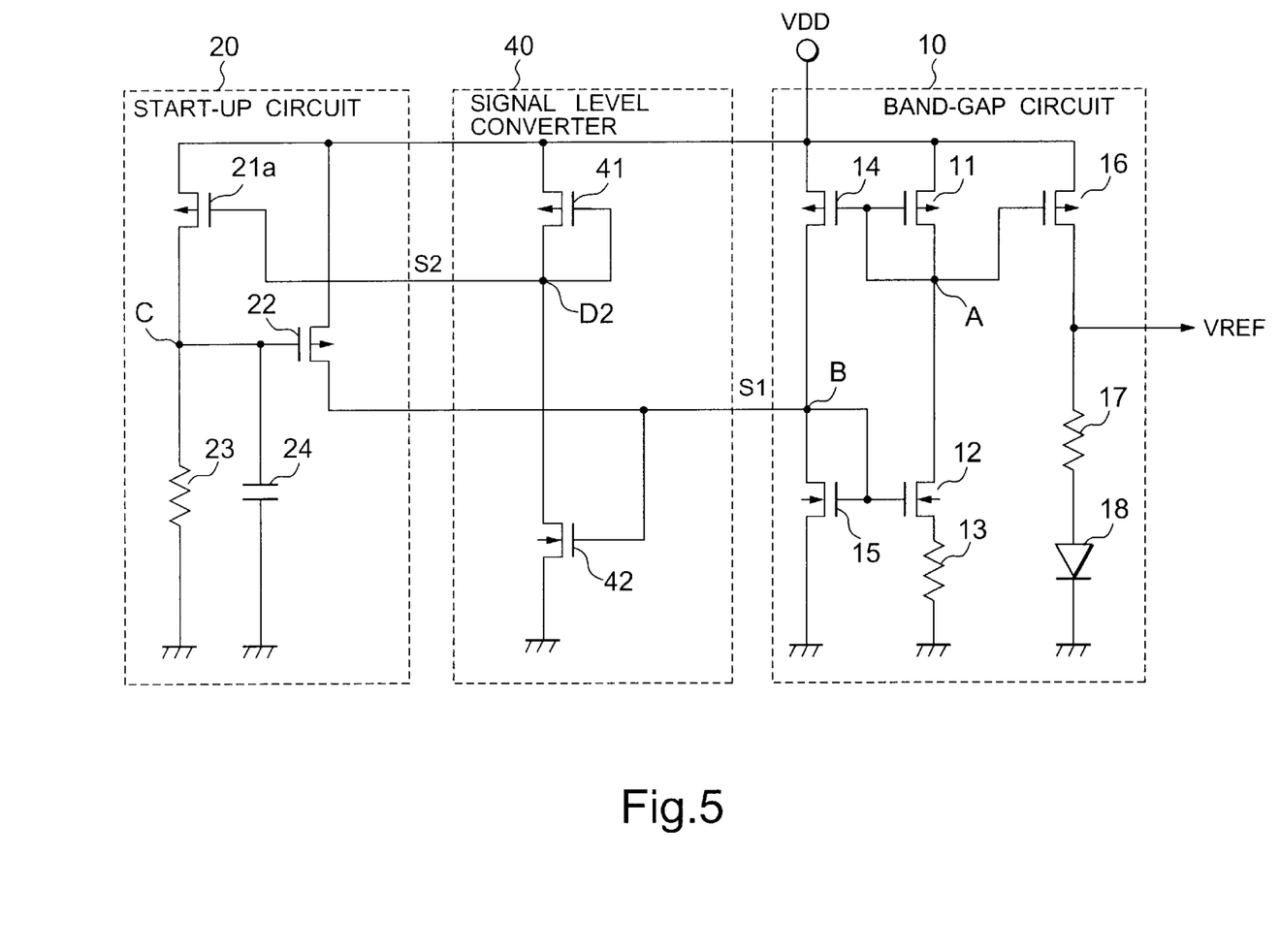

According to an aspect of the present invention, a band-gap reference circuit (20, 30, 10), which generates and supplies a predetermined stable voltage (VREF), is provided. The band-gap reference circuit is comprised of a start-up circuit (20), which is comprised of a start-up transistor (21a) that is smaller than each of those in a band-gap circuit (10) which generates a predetermined stable voltage and which outputs a start signal (S1); and a signal level converter (30), which converts said start signal (S1) to a second start signal (S2) that is supplied to said start-up transistor (21a). An example of this band-gap reference circuit is illustrated in FIGS. 3 and 5.

BRIEF DESCRIPTION OF DRAWINGS

The above and other objects, features and advantages of the present invention will become more apparent from the following detailed description, when taken in conjunction with the accompanying drawings, wherein.

DETAILED DESCRIPTION OF THE PREFERRED EMBODIMENTS (First Embodiment)

FIG. 3 shows a band-gap reference circuit according to an embodiment of the present invention. The present invention features a signal level converter 30 attached between band-gap circuit 10 and start-up circuit 20. Signal level converter 30 converts signal S1 output from band-gap circuit 10 to signal S2, which can control the behavior of start-up circuit 20. Signal S1 is one that does not match the signal voltage level required to turn on and off a PMOS transistor (PMOS 21a) with a short channel and accordingly the absolute value of a threshold voltage level, but does match the one for that with a long channel and accordingly the absolute value of a high threshold voltage level. Signal S2 results from the conversion performed by the signal level converter 30 and matches one that can properly control PMOS 21a in the start-up circuit 20. The structure of the band-gap reference circuit shown in FIG. 3 will now be described.

In FIG. 3, the band-gap circuit 10 shown has the same configuration as that of the conventional one in FIG. 1, comprising:

a PMOS transistor (PMOS 11), which has its source connected to the power source $V_{DD}$, and its gate and drain connected to each other as well as to node A;

an NMOS transistor (NMOS 12), which has its drain connected to the drain of PMOS 11;

first resistor 13, which has one terminal connected to the source of NMOS 12 and the other connected to the ground;

a PMOS transistor (PMOS 14), which has its source connected to power source $V_{DD}$ and its gate connected to the drain of PMOS 11;

an NMOS transistor (NMOS 15), which has its drain connected to its gate, the drain of PMOS 14, and the gate of NMOS 12, forming node B and its source connected to the ground;

a PMOS transistor (PMOS 16), which has its source connected to power source $V_{DD}$, its gate connected to node A and its drain being the reference voltage output terminal;

second resistor 17, which has one terminal connected to the drain of PMOS 16; and diode 18, which has its anode connected to the other terminal of the second resistor 17 and its cathode connected to the ground.

In FIG. 3, start-up circuit 20 is comprised of:

a PMOS transistor (PMOS 21a), which has its source connected to power source $V_{DD}$;

a PMOS transistor (PMOS 22), which has its source also connected to power source $V_{DD}$, and which also has its gate connected to the drain of PMOS 21a, forming node C;

third resistor 23, which has one terminal connected to node C and the other terminal connected to the ground; and capacitor 24, which has one terminal connected to node C and the other terminal connected to the ground.

Signal level converter 30, according to the present invention, is comprised of:

a PMOS transistor (PMOS 31), which has its source connected to power source $V_{DD}$, and its gate inputs the first signal S1 supplied from node A inside band-gap circuit 10;

an NMOS transistor (NMOS 34), which has its gate and drain connected to the drain of PMOS 31, and its source connected to the ground;

a PMOS transistor (PMOS 33), which its source connected to power source $V_{DD}$, and its drain and gate connected together at node D1, which outputs signal S2 to the gate of PMOS 21a inside start-up circuit 20; and an NMOS transistor (NMOS 34), which has its drain connected to the drain of PMOS 33, its gate connected to the drain of NMOS 32, and its source connected to the ground.

In FIG. 3, the respective channel lengths of PMOS 11, PMOS 14, PMOS 16, PMOS 22 and PMOS 31 are made to be a first channel length of, for example, 80 μm, and the channel lengths of PMOS 21a and PMOS 33 are made to be a second channel length, which is smaller than the first channel length, for example, 0.35 μm. In addition, the respective channel lengths of NMOS 12, NMOS 15, NMOS 32, and NMOS 34 are made to be a third channel length, which is larger than the second channel length, for example, 70 μm.

Signal S1, which matches PMOS 31 with threshold voltage $V_{tp1}$, is converted into signal S2, which matches PMOS 21a with threshold voltage $V_{tp2}$ by three current mirror circuits; the first one being formed from PMOS 11 inside band-gap circuit 10 and PMOS 31 inside signal level converter 30, the second one being formed from NMOS 32 and NMOS 34 inside signal level converter 30, and the third one being formed from PMOS 33 inside signal level converter 30 and PMOS 21a inside start-up circuit 20.

The channel width of PMOS 31 is set to be, for example, three times the channel width of PMOS 11. The channel width of NMOS 34 is set to be, for example, four times the channel width of NMOS 32. The channel width of PMOS 21a is set to be, for example, eighteen times the channel width of PMOS 33. With this structure, 216 (3×4×18) times the current flowing through PMOS 11 is allowed to flow through PMOS 21a while power is first being supplied.

Figure 4:
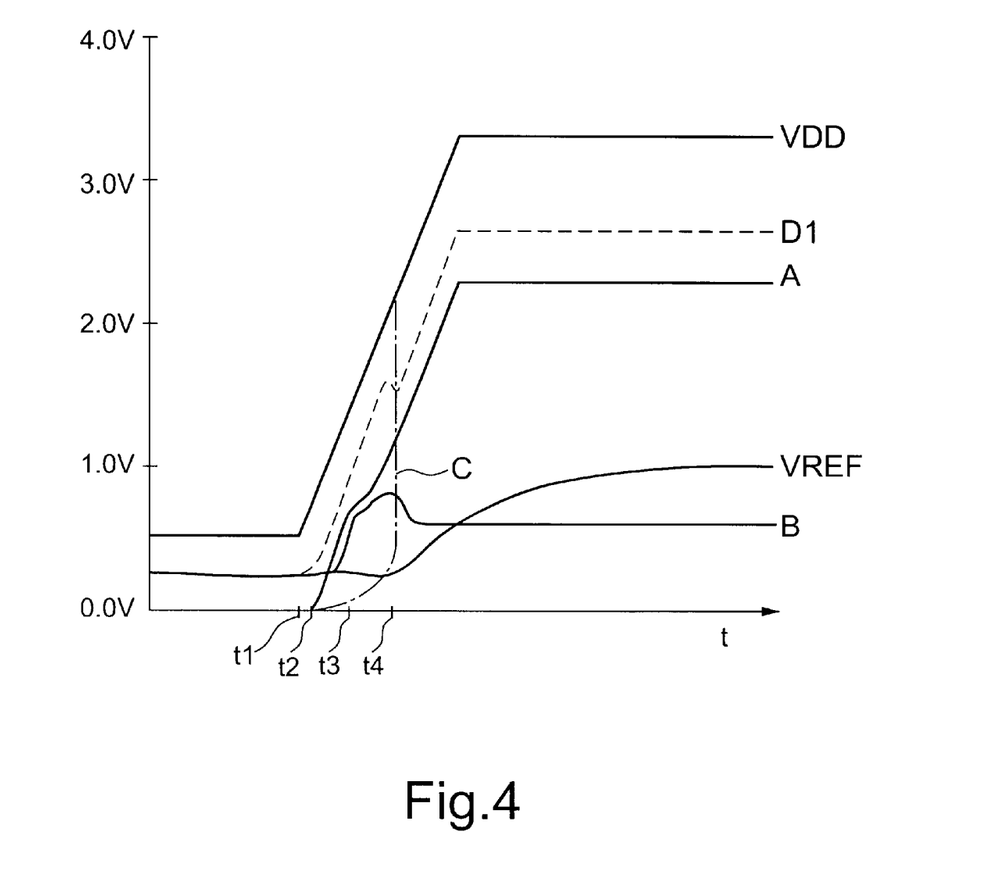
FIG. 4 is a timing chart showing the operation of the band-gap reference circuit, according to the first embodiment of the present invention shown in FIG. 3; and, FIG. 5 shows the configuration of a band-gap reference circuit according to the second embodiment of the present invention.

FIG. 4 is a timing chart showing the operation of this embodiment of the present invention when power is first supplied. FIG. 4 shows this operation under the same conditions as the one where power source voltage $V_{DD}$ was increased from 0.6 V to 3.3V in the same manner as shown in FIG. 2. As described before while referencing FIG. 2, this condition causes a malfunction in the conventional circuit where PMOS 21 has a short channel length. However, according to this embodiment of the present invention, such malfunction can be prevented. The workings of the band-gap reference circuit, according to the present invention, shown in FIG. 3 at the time when power is first supplied will now be described in detail while referencing FIG. 4.

When the voltage level of power source $V_{DD}$ is at 0.6 V (time-frame t<t1), node A has the voltage level at which the very small amount of current flowing in the weak inversion region of PMOS 11 balances with that of current flowing in the weak inversion region of NMOS 12. Similarly, node B has the voltage level on which the balance of very small amounts of current in the respective weak inversion regions of PMOS 14 and NMOS 15 exists. By being connected to the ground via resistor 23, node C is at ground level (0 V). The voltage level at node D1 is accordingly decided from the amount of current flowing through PMOS 33 via NMOS 34, which forms a current mirror circuit with NMOS 32. The amount of current flowing through NMOS 32 is accordingly decided from the amount of current flowing through PMOS 31, which forms a current mirror circuit with PMOS 11 with its weak inversion region, through which a very small amount of current can flow. However, since the amount of current flowing within the range of the weak inversion region of PMOS 33 is very small, the voltage at node D1 falls at least within the range of ($V_{DD}$ voltage level–node D1 voltage level)<the absolute value of PMOS 33 threshold voltage $V_{tp2}$. Therefore PMOS 33 is guaranteed to maintain its off position. As a result, PMOS 21a, which has the same threshold voltage $V_{tp2}$, is guaranteed to remain off, ensuring all of the MOS transistors comprising the band-gap reference circuit will remain off.

Beginning at time-point t1, as power source voltage $V_{DD}$ gradually begins to appreciate, PMOS 33 turns on. After that, node D1 appreciates keeping pace with $V_{DD}$, while maintaining roughly the relationship of ($V_{DD}$ voltage level–node D1 voltage level)=the absolute value of $V_{tp2}$. The voltage level at node C in start-up circuit 20 begins to appreciate at a remarkably slow rate when compared to the rise in power source voltage $V_{DD}$ due to resistor 23 and capacitor 24.

At time-point t2, as power source $V_{DD}$ surpasses the absolute value of the respective threshold values of long-channeled MOS transistors such as PMOS 11 and PMOS 14, PMOS 11 turns on. Node A then rises keeping pace with power source $V_{DD}$, maintaining a difference of roughly $V_{tp1}$ lower than $V_{DD}$. In addition, since together with the rise in power source voltage $V_{DD}$, the difference between the voltages of the gate and source of PMOS 22 increases, PMOS 22 is turned on deeply and node B is charged rapidly.

At time-point t3, the respective gate voltages for NMOS 12 and NMOS 15 surpasses threshold voltage $V_{tn}$ due to the rise in the voltage at node B, so they turn on. As a result, the rise in the voltage at node A temporarily stagnates. The amount of current flowing to PMOS 11 increases, along with the current flowing to PMOS 31, with which it has a current-mirror relationship, as does the current flowing to NMOS 32 and NMOS 34 because the difference between the voltages of power source $V_{DD}$ and node A escalates due to the stagnation in voltage appreciation at node A. However, at time-point t4, the voltage at node D1 temporarily drops, there is a sudden upsurge in the amount of current flowing to PMOS 33, and PMOS 21a, which is its current mirror, reacts with the same upsurge. Accordingly, the voltage at node C begins to rapidly appreciate towards the power source voltage $V_{DD}$. As the voltage at node C approaches the power source voltage $V_{DD}$, PMOS 22 turns off; therefore start-up circuit 20 becomes electrically isolated from band-gap circuit 10. As the power source voltage $V_{DD}$ stabilizes at its predetermined level (3.3 V in FIG. 2), the outputs of the respective terminals A and B of band-gap circuit 10, and the output reference voltage $V_{REF}$ all stabilize in the end at their respective predetermined voltage levels.

As mentioned earlier, in the present embodiment with signal level converter 30, since the voltage at node D1 becomes ($V_{DD}$ voltage−node D1 voltage)<the absolute value of PMOS 33 threshold voltage $V_{tp2}$ during the time period leading up until to time-point t1 where the power source voltage $V_{DD}$ is 0.6 V, PMOS 21a, which has threshold voltage $V_{tp2}$, is guaranteed to be on. Therefore, it is possible to attain a proper start-up regardless of how low the voltage $V_{DD}$ gets during a power interruption. Furthermore, the new addition of the signal level converter 30 is absorbed by the remarkable reduction in the surface area occupied by changing the channel length of PMOS 21a from 80 μm to 0.35 μm, thereby making it possible to achieve extensive reductions in surface area.

(Second Embodiment)

FIG. 5 is a schematic drawing showing a second embodiment of the present invention. In FIG. 5, since the structure of band-gap circuit 10, as well as that of start-up circuit 20 are the same as those shown in FIG. 3 according to the first embodiment of the present invention, their explanation is accordingly omitted here. With this second embodiment, signal level converter 40 includes two PMOS transistors (PMOS 41 and NMOS 42). PMOS 41 has its source connected to power source $V_{DD}$ and its drain and gate connected at node D2, and supplies signal S2 to the gate of PMOS 21a in start-up circuit 20. NMOS 42 has its drain connected to the drain of PMOS 41, its gate connected to node B, and its source connected to the ground.

PMOS transistors (PMOS 11, PMOS 14, and PMOS 16) in band-gap circuit 10 and PMOS transistors (PMOS 20 and PMOS 22) in start-up circuit 20 all have the same, first channel length. The channel lengths of PMOS 21a in start-up circuit 20 and PMOS 41 are made to be a second channel length, which is smaller than the first channel length. The respective channel lengths of NMOS transistors (NMOS 12 and NMOS 15) in start-up circuit 20, and NMOS 42 are made to be a third channel length, which is larger than the second channel length. In addition, NMOS 15 in band-gap circuit 10 and NMOS 42 in signal level converter 40 are formed as a current mirror; in the same manner, PMOS 41 in signal level converter 40 and PMOS 21a in start-up circuit 20 are also formed as a current mirror.

Signal level converter 40 inputs signal S1, which has been matched to the signal level for turning on/off NMOS 42 with threshold voltage $V_{tn}$, and then outputs signal S2, which results from converting signal S1 so that signal S2 can be matched to a signal level that can turn on/off PMOS 21a with threshold voltage $V_{tp1}$.

Also in the schematic drawing in FIG. 5, when the lowest voltage of power source $V_{DD}$ is 0.6 V, which is higher than the absolute value of threshold value $V_{tp2}$ (=−0.5 V) of PMOS 21a, but lower than the absolute value of threshold value $V_{tp1}$ (=−0.9 V), for example, of PMOS 11, only a small amount of current flows to the weak inversion regions of NMOS 15 and NMOS 42 because the voltage level at node B falls lower than threshold voltage $V_{tn}$ of NMOS 15. Accordingly, PMOS 21a turns off due to the difference between power source voltage $V_{DD}$ and the voltage at node D2 being lower than the absolute value of threshold voltage $V_{tp2}$ of PMOS 41 and PMOS 21a. As a result, the voltage at node C becomes 0 V, which is the same result as that from the structure shown in FIG. 3.

When power source voltage $V_{DD}$ begins to rise from 0.6 V, the difference between power source voltage $V_{DD}$ and the voltage at node C grows, PMOS 22 is turned on deeply, and node B is charged quite quickly. When the difference between the voltage at node B and the ground level surpasses threshold voltage $V_{tn}$ of NMOS 15, NMOS 15 turns on and at the same time NMOS 42 also turns on, pulling down the voltage at node D2. Accordingly, since the amount of current flowing through PMOS 41 increases and the amount of current flowing through PMOS 21a also increases, the voltage at node C rapidly appreciates towards the level of power source voltage $V_{DD}$ turning off PMOS 22. As a result, start-up circuit 20 is isolated from the band-gap circuit 10.

In this manner, according to the circuit structure in FIG. 5, it is possible to attain a proper start-up regardless of how low the voltage of $V_{DD}$ gets during a power interruption, as in FIG. 3. Besides, since signal level converter 40 in FIG. 5 can be formed with only two MOS transistors, the required surface area can be further reduced in comparison with the structure shown in FIG. 3.

The circuits, according to the present invention, as described above can be used for a voltage source for an A/D converter, a PLL circuit, etc.

The circuits, according to the present invention, have been described in connection with several preferred embodiments. It is to be understood that the subject matter encompassed by the present invention is not limited to that specified embodiment. On the contrary, it is intended to include as many alternatives, modifications, and equivalents as can be included within the spirit and scope of the following claims.

What is claimed is:

1. A band-gap reference circuit, which generates and supplies a predetermined stable voltage (VREF), comprising:

a start-up circuit, which is comprised of a start-up transistor that is smaller than each of those in a band-gap circuit which generates a predetermined stable voltage and which outputs a start signal; and a signal level converter, which converts said start signal to a second start signal that is supplied to said start-up transistor.

2. The band-gap reference circuit, according to claim 1, wherein said start-up transistor has a threshold voltage with its absolute value being smaller than each of those of the threshold voltages of transistors in said band-gap circuit.

3. The band-gap reference circuit, according to claim 1, wherein said signal level converter is comprised of a first conversion transistor that cooperates with a reference-voltage generation transistor so as to form a current mirror circuit.

4. The band-gap reference circuit, according to claim 3, wherein said signal level converter is further comprised of a second conversion transistor that cooperates with said start-up transistor so as to form a current mirror circuit.

5. The band-gap reference circuit, according to claim 3, wherein said start-up transistor is (1/n) the channel length of said reference-voltage generation transistor and (1/n) the channel width of said reference-voltage generation transistor, where said n denotes a certain positive number larger than 1.

6. The band-gap reference circuit, according to claim 1, wherein said signal level converter is comprised of a load transistor and a drive transistor.

7. The band-gap reference circuit, according to claim 6, wherein said load transistor has the same channel length as that of said start-up transistor so as to form a current mirror circuit.

8. The band-gap reference circuit, according to claim 1, wherein all of said transistors are of MOS type.

9. The band-gap reference circuit, according to claim 4, wherein said first conversion transistor, said reference-voltage generation transistor, said second conversion transistor, and said start-up transistor are of the same type of MOS transistor.

10. The band-gap reference circuit, according to claim 9, wherein said first conversion transistor, said reference-voltage generation transistor, said second conversion transistor, and said start-up transistor are of PMOS type.

11. The band-gap reference circuit, according to claim 1, wherein said band-gap reference circuit is used for an A/D converter.

12. The band-gap reference circuit, according to claim 1, wherein said band-gap reference circuit is used for a PLL circuit.

13. A band-gap reference circuit, comprising:
a band-gap circuit outputting a predetermined voltage in response to a level of a first control signal which is generated according to a power source voltage;
a start-up circuit supplying a second control signal to said band-gap circuit, said second control signal stabilizing said predetermined voltage when said power source voltage is applied; and
a signal level converter supplying a third control signal to said start-up circuit, a level of said third control signal converted from said first control signal to be proper for controlling said start-up circuit.

14. The band-gap reference circuit according to claim 13, wherein said signal level converter includes a current mirror circuit, said current mirror circuit outputs said third control signal in response to said first control signal, and said level of said third control signal is decided from the amount of current flowing through said current mirror circuit.

15. The band-gap reference circuit according to claim 13, wherein said band-gap circuit includes a first transistor for generating said first control signal, said first transistor has a first threshold voltage,
wherein said start-up circuit includes a second transistor which is controlled with said third control signal, said second transistor has a second threshold voltage with its absolute value being smaller than said first threshold voltage, and
wherein said signal level converter converts from said level of said first control signal to said level of said third control signal which is proper to render said second transistor turned ON and OFF.

16. The band-gap reference circuit according to claim 13, wherein said band-gap circuit includes a first transistor for generating said first control signal,
wherein said start-up circuit includes a second transistor controlled with said third control signal,
wherein said signal level converter includes third and fourth transistors and a first current mirror circuit, said third transistor supplies an input current to said first current mirror circuit in response to level of said first control signal, said level of third control signal is decided from the amount of current flowing through said first current mirror circuit and said fourth transistor, and
wherein said first and third transistors operate as a second current mirror circuit, said second and fourth transistors operate as a third current mirror circuit.

17. The band-gap reference circuit according to claim 16, wherein each of said first and third transistors have a first threshold voltage, and each of said second and fourth transistors have a second threshold voltage with its absolute value being smaller than said first threshold voltage.

18. The band-gap reference circuit according to claim 13, wherein said band-gap circuit includes a first transistor, wherein said start-up circuit includes a second transistor controlled with said third control signal,
wherein said signal level converter includes third and fourth transistors connected in series between a power source terminal supplied with said power source voltage and ground, said fourth transistor is controlled with said first control signal, said third control signal is decided from the amount of current flowing through said third and fourth transistors, and
wherein said first and third transistors operate as a first current mirror circuit, said second and fourth transistors operate as a second current mirror circuit.

19. A band-gap reference circuit, comprising:
a band-gap circuit;
a signal level converter coupled to said band-gap circuit; and
a start-up circuit coupled to said band-gap circuit and said signal level converter;
wherein said band-gap circuit includes a first transistor having a current path between a power source line and a first node for outputting a reference voltage;
wherein said start-up circuit includes a second transistor having a current path between said power source line and a second node, said second node coupled to a control gate of said first transistor;
wherein said signal level converter coupled between said control gate of the first transistor and a control gate of said second transistor.

* * * * *